(12) United States Patent
Valcarenghi et al.

(10) Patent No.: US 9,601,288 B2
(45) Date of Patent: Mar. 21, 2017

(54) APPARATUS FOR FLOOR CLEANING, WITH IMPROVED KEY

(71) Applicant: NILFISK A/S, Brondby (DK)

(72) Inventors: Paolo Valcarenghi, San Giorgio (IT); Filippo Marchetti, Cremona (IT)

(73) Assignee: NILFISK A/S, Brondby (DK)

( * ) Notice: Subject to any disclaimer, the term of this patent is extended or adjusted under 35 U.S.C. 154(b) by 31 days.

(21) Appl. No.: 14/284,684

(22) Filed: May 22, 2014

(65) Prior Publication Data

US 2015/0008997 A1 Jan. 8, 2015

(30) Foreign Application Priority Data

Jul. 2, 2013 (IT) .................................. PN13A0037

(51) Int. Cl.
*H01H 36/00* (2006.01)
*G07C 9/00* (2006.01)
(Continued)

(52) U.S. Cl.
CPC ........ *H01H 36/008* (2013.01); *A47L 11/4008* (2013.01); *G01R 33/072* (2013.01);
(Continued)

(58) Field of Classification Search
CPC . H01H 36/008; A47L 11/4008; G01R 33/072; G07C 9/00174; G07C 9/00738; Y10T 70/7057–70/7904
See application file for complete search history.

(56) References Cited

U.S. PATENT DOCUMENTS 3,953,712 A * 4/1976 Horvath ................. G06K 7/083
235/449
4,112,294 A 9/1978 Pressiat
(Continued)

FOREIGN PATENT DOCUMENTS

| AU | 14576 76 A | 7/1977 |
| WO | WO 00/57006 A1 | 9/2000 |
| WO | WO 2007/133287 A1 | 11/2007 |

OTHER PUBLICATIONS

Apr. 2, 2014 Italian Search Report issued in Italian Application No. 20130037.
(Continued)

*Primary Examiner* — Hai Phan
*Assistant Examiner* — Orlando Bousono
(74) *Attorney, Agent, or Firm* — Oliff PLC

(57) ABSTRACT

Apparatus for floor cleaning, having a cavity that opens on the dashboard, a plurality of mechanically similar interchangeable keys, and suitable to be inserted completely into and operate with said cavity, two or more Hall-effect sensors arranged outside said cavity, at least one first key containing at least one magnet, and at least one second key including at least one respective second magnet, which are in functional correspondence with respective predefined sensors.
Said magnets do not interfere with sensors to which they are not geometrically connected, and for this purpose they are aligned on a same straight line, and the insertion of said keys causes a movement of said magnets toward the respective sensors with a motion orthogonal to said straight line.

8 Claims, 11 Drawing Sheets

(51) Int. Cl.
  *G01R 33/07* (2006.01)
  *A47L 11/40* (2006.01)

(52) U.S. Cl.
  CPC ..... *G07C 9/00174* (2013.01); *G07C 9/00738* (2013.01); *G07C 2009/00968* (2013.01); *Y10T 70/7057* (2015.04); *Y10T 70/7073* (2015.04); *Y10T 70/7079* (2015.04); *Y10T 70/7904* (2015.04)

(56) References Cited

U.S. PATENT DOCUMENTS

| | | | | |
|---|---|---|---|---|
| 4,287,733 A * | 9/1981 | Gomez-Olea | G07C 9/00738 | 70/276 |
| 4,399,673 A * | 8/1983 | Gotanda | E05B 17/22 | 70/276 |
| 4,562,711 A * | 1/1986 | Fliege | G07C 9/00738 | 70/276 |
| 4,603,563 A * | 8/1986 | Mochida | E05B 47/00 | 70/276 |
| 4,716,400 A * | 12/1987 | Kuribayashi | A47G 29/10 | 340/572.1 |
| 4,734,693 A * | 3/1988 | Dluhosch | E05B 49/006 | 235/382.5 |
| 5,085,062 A * | 2/1992 | Capdevila | G07C 9/00738 | 70/276 |
| 5,862,691 A * | 1/1999 | Friedrich | E05B 17/22 | 340/426.28 |
| 6,169,650 B1 | 1/2001 | Albrecht | | |
| 6,318,137 B1 * | 11/2001 | Chaum | E05B 49/002 | 340/5.67 |
| 2003/0205070 A1 * | 11/2003 | Chaum | E05B 49/002 | 70/278.3 |
| 2006/0283219 A1 * | 12/2006 | Bendz | E05B 47/0012 | 70/431 |
| 2009/0195338 A1 * | 8/2009 | Deininger | B60R 25/04 | 335/205 |
| 2010/0096451 A1 * | 4/2010 | Bossoney | G06K 19/06196 | 235/382 |
| 2013/0033361 A1 | 2/2013 | Lickfelt et al. | | |
| 2013/0141211 A1 | 6/2013 | Troff et al. | | |

OTHER PUBLICATIONS

Jul. 2, 2013 Written Opinion issued in Italian Application No. 20130037 (with translation).

* cited by examiner

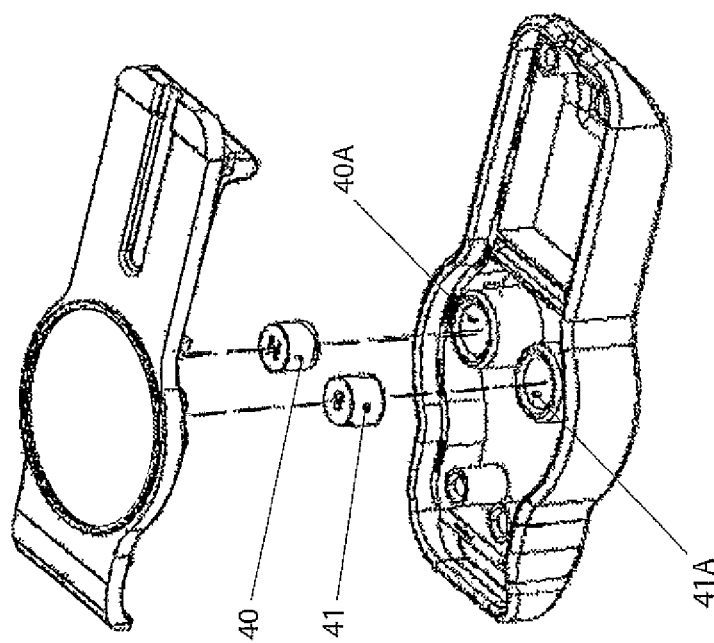
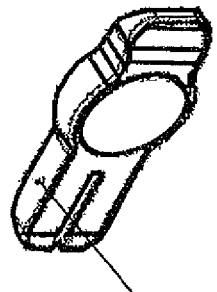
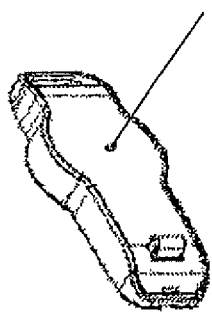
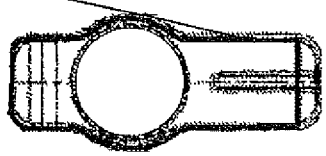

APPARATUS FOR FLOOR CLEANING, WITH IMPROVED KEY

The present invention is relative to a key of improved type used to start and operate an apparatus, mainly for industrial applications or on large surfaces, suitable for the washing and possible drying of floors.

The means and manners for activating the general operation of an industrial washing apparatus are based, as is known, on a device comprising:
- a key of automobile type, but without the radio-electrical means of reciprocal identification, safety and anti-theft control;
- an electro-mechanical key block, arranged at a respective key-lock on the dashboard of the same apparatus, suitable to be activated by the insertion of the key; this normally works in two successive times, that is, with the first key rotation step in the key block are activated some basic but selected on-board services, and with the subsequent rotation step are activated all the systems on board, and in particular the drive and operating system of the functional devices on the machine itself, consisting of cards, relays, motors, etc. Two sorts of problems have been found, especially in large fleets of machines:
- the first category of problems, typical with uses of this type, stems from the fact that said machines are in general open or not completely protected from the environment, which, due to their use, is often dusty, and therefore they are exposed to water, dust, grime, etc.: obviously, the continuous use of the machine causes the progressive entrance of such foreign materials even inside the key-lock, and thus inside the electro-mechanical block, which in time causes it to close or jam, or also to cutting off the electrical contacts present inside the block;
- the second category of problems is generated by the fact that, especially when large fleets of machines are considered, the machines themselves are used for two types of operation; a first type of operation consists of the activation and general operation of the machine for its normal operation, so that the operator must be allowed to access and operate all the systems installed on the apparatus; the second type of use refers to the fact that, in a programmed or a non-continuous mode, the machine itself must be checked and must go through regular maintenance.

Since the existing machines are equipped with electronic systems that are also considerably complex, the operator that carries out such maintenance checks must be provided with a key with which it is possible to access only the electronic systems which must be checked, but which does not make it possible to access and operate the other operating or functional systems of the machine.

In practice, there is the requirement of having the machine equipped with an access system, that only for the sake of simplicity well be termed "key-lock", through which can be accessed in a selective manner two or more on-board systems, in which each on-board system can be operated by a particular type of key that is different from any other type of key through which it is possible to access a different system (or systems) on board the machine.

This requirement of also having in effect a master key is in general well known in other commodity sectors, and therefore a needless explanation is avoided.

A typical solution of this problem is to design safe and specific access systems provided with radio-electronic and mechanical means of mutual recognition between an electronic key card and a key-lock (in particular a logic device for the transmission, reception and processing of data included in the same key-lock, to be transmitted to and received by the relative electronic key card).

However, these means in general, although they are surely effective, have the serious drawback of being rather costly, unacceptably so for this industrial sector, which must strive to be extremely competitive.

U.S. Pat. No. 4,112,294 discloses an access system of general type comprising a reader and a magnetically coded card to be inserted into said reader, which is designed to read the coded data from the card, or from equivalent but not identically encoded cards.

The card is coded by means of small permanent magnets set in a non-magnetic body of the card and arranged in a predefined position.

The reader includes a certain number of Hall-effect sensors positioned so that, when the card is inserted into the reader, the relative magnets position themselves in front of respective Hall-effect sensors.

However, the encoding of said card is achieved simply by creating suitable housings in fixed positions in the card and by inserting, or not inserting, the various magnets in said fixed positions.

The possibility of inserting, or not inserting, with different combinations and arrangements the various magnets in respective housings makes it possible to create different cards with respective different magnetic encodings, which are read and recognized as such by the various sensors that send the respective information to relative command and control means, which process said information and transmit pertinent command signals to relative further processing or actuating devices, in themselves known.

This solution is effective on the general plane, but it is only a solution of logical and functional type, and it does not satisfy the basic requirement of being particularly efficient in a harsh operating environment that is potentially heavily contaminated with dust, moisture, rain, vibrations, etc.

U.S. patent (application) No. 2013/033361 discloses a controlled system of access and operation in a vehicle that includes a magnetic-card reader and a plurality of magnetic cards suitable to operate with that reader; the magnetic card is also built into a traditional key of electro-mechanical type.

The functionality of the logic and functional part of this solution is in all manners similar to the one previously described, but also with the additional characteristic that the magnets are applied so that, from one card (key) to another, the magnets are inserted with differentiable, that is, inverted polarities.

This possibility of providing cards with magnets having inverted polarities from one card to another makes it possible to produce a combination of more cards having different magnetic characteristics, and in the final analysis different cards that work in selectively different manners in the control circuits, in particular in the relative card reader associated with said different cards.

Although such a solution is certainly functional, it still does not resolve the fundamental requirement of being able to work in a harsh operating environment that is potentially heavily contaminated with dust, moisture, rain, vibrations, etc.

Moreover, a problem may occur with such configuration. In fact, if (with reference to FIG. 3 of said US 2013/033361), for the purpose of producing more and different combinations of magnets with different polarities, which must work on respective Hall-effect sensors, it could happen, and it often happens, that two magnets even if not adjacent to each other, mounted and aligned on a lateral edge of the same key, have the same polarity even if other magnets on the same card have different polarities.

If said key is inserted in the customary manner in the relative key lock, that is in such a way that said magnets are displaced with a movement parallel to the alignment line of the same, a condition occurs, naturally during the insertion travel of the key, wherein some of said magnets may approach one or more sensors, and then move away to a point where they finally position themselves opposite the respective sensor with which they are to interact.

This possibility generates, as has been verified experimentally, a possible "interference" between the magnetic fields of some of the magnets mounted on the key and some sensors mounted on a relative sensing and control apparatus.

Such a condition, that is, the interference between magnets and sensors that, based on the design data, do not correspond to said magnets and do not have to be sensitive to their transit, causes automatic and obvious negative consequences on the operation of the whole access control system.

Therefore it would be desirable, and it is the main objective of the present invention, to develop an apparatus for floor cleaning provided with means for accessing the on-board electrical and electro-mechanical systems and designed and built so as to eliminate or at least significantly reduce the disadvantages just mentioned above.

Such apparatus must be such as to make it possible to manufacture it with readily available technologies that guarantee a sure and easily achievable result.

These and other objectives are achieved with an apparatus for floor washing built and operating according to the enclosed claims.

Characteristics and advantages of the invention will be evident from the following specification, given as a non-limiting example, with reference to the enclosed figures, wherein:

FIG. 1 and FIG. 2 are respective external perspective views of a key for a floor cleaning apparatus according to the invention;

FIGS. 3 and 4 are respective front and side views of the key of FIGS. 1 and 2;

FIG. 5 illustrates an exploded and perspective outside view of the key of the preceding figures;

Figure 6:
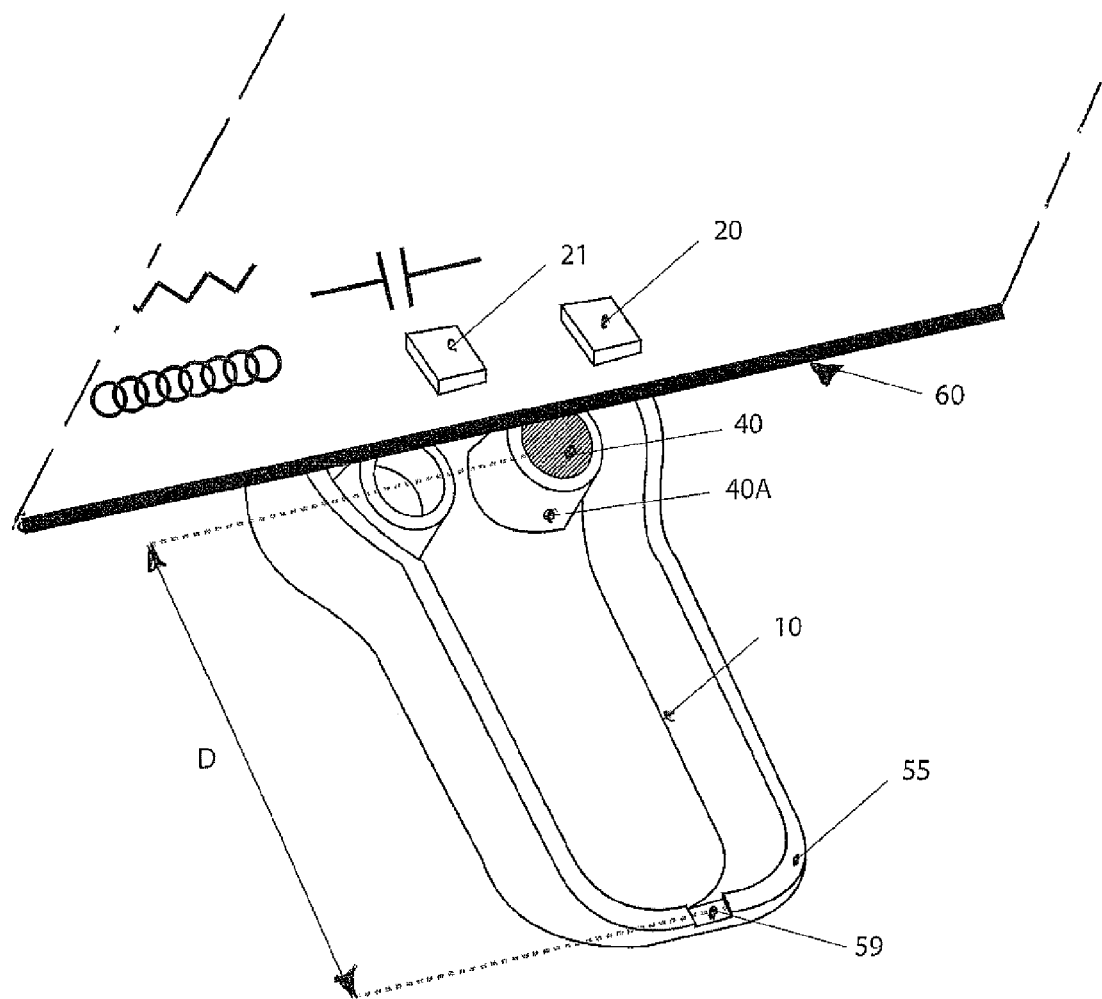
FIG. 6 illustrates an exploded and perspective view similar to FIG. 5 of a variant of the key according to the invention.

It should be noted that the sensors 20, 21, 22 that will be cited hereunder are briefly defined as being of "Hall effect", but naturally it is understood that they are connected to suitable measurement and processing means designed to determine the Hall effect to which they are subjected.

With reference to the figures, an apparatus according to the invention comprises:
  a dashboard 50;
  a cavity 55 arranged inside said dashboard and opening through a relative aperture 51 on said dashboard 50; for greater clarity, said cavity 55 is formed and delimited internally by the wall 6 (see FIG. 15);
  a plurality of keys 10 that are mechanically interchangeable and similar to each other; for the sake of simplicity, said mechanically similar keys are represented by a single key 10 as in FIGS. 1, 2, 3 and 4, because externally they are all identical and therefore indistinguishable.

Near said cavity, and outside the same (by the term "outside" the cavity 55 here and below is intended the part behind the dashboard that substantially delimits, and encompasses, the cavity itself) is arranged a plurality of Hall-effect sensors 20, 21 and 22 (see FIGS. 8 to 11A) in which the sensor 22 and the relative magnet 42 are shown only in FIGS. 9 and 9A.

Figure 12A:
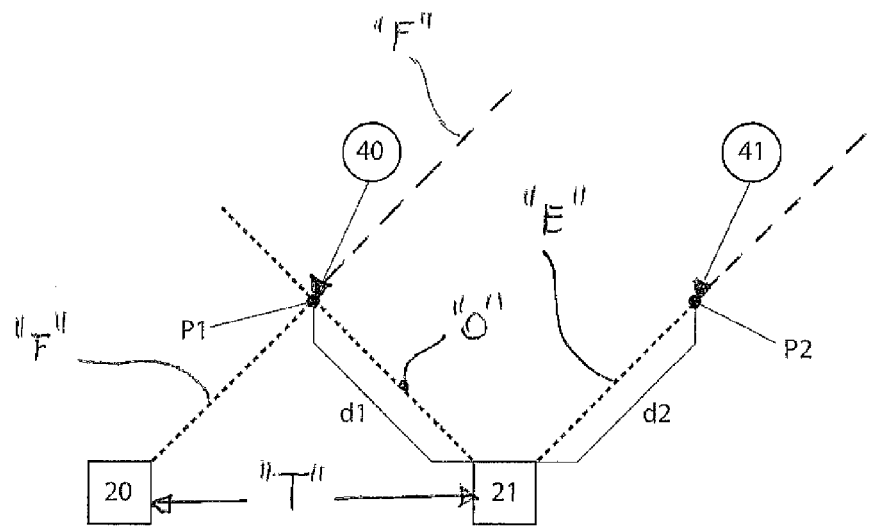
FIGS. 12A and 12B illustrate respective diagrams that exemplify the basic contents of the invention.
Figure 12B:
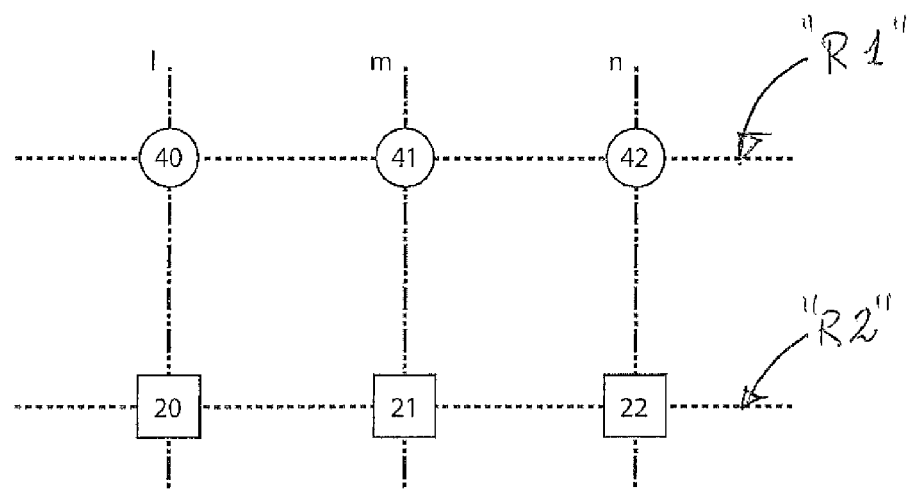

Reference is made now to FIGS. 12A and 12B. In FIG. 12A is shown a two-dimensional configuration, that is, on the plane of the sheet itself, which includes the two sensors 20 and 21, ideally associated to a key-lock, not explicitly shown.

Externally to said two sensors are provided two magnets 40 and 41 that are ideally included in the key under discussion and not explicitly shown, and which must be inserted in said key-lock.

For the purpose of activating a predetermined operation of the key and lock assembly, it is defined that the magnet 40 must work, that is, it must approach the sensor 20 as closely as possible, and this distance is defined for what concerns the magnet 41 in relation to the sensor 21.

For the purpose of avoiding or limiting as much as possible the risk of interference between a magnet and a sensor which must not correspond to it, and with which it must not interact, it is necessary that when a magnet moves to reach the respective sensor the maximum distance must be maintained from the other sensor.

In the example of FIG. 12A it is assumed that the general case is shown in which the magnet 41 must approach as closely as possible the respective sensor 21, which can be conventionally shown on the two-dimension plane of the sheet by making the magnet 41 coincide with the respective sensor 21.

Thus, to guarantee the maximum distance of the magnet 41 from the other sensor 21, with which it is not to interfere, a condition must be accepted such that the minimum possible distance between the magnet 41 and said sensor 20 is exactly when the magnet 41 overlies the sensor 21, while in any other condition the magnet 41 must be at a distance from the sensor 20 greater than the distance "T" between the two sensors 20 and 21.

Thus the magnet 41 moves in a rectilinear motion (in fact, the relative key is inserted in its key-lock with a generally rectilinear motion) until it overlies the relative sensor 21 along the path "E".

In a corresponding manner the sensor 40 must move with a parallel and still rectilinear motion along the corresponding path "F" until it overlies the respective sensor 20.

However, in this case said path "F" passes through a point "P1" of minimum distance "d1" from the sensor 21, which is the intersection of the path "F" with the straight line "O" passing through the sensor 21 and orthogonal to said path "F".

From this point "P1" on, the magnet 40 begins again to move away from the sensor 21; and said distance "d1" may be completely comparable with the distance "d2" of the magnet 41 from the same sensor 21.

And thus this situation can certainly generate an unwanted interference between the magnet 40 and the sensor 21, which is in fact the situation that is to be avoided, and that is exactly what the present invention avoids.

With reference to FIG. 12B, the solution looked for consists of positioning the three magnets 40, 41 and 42 along a same first straight line "R1", and of positioning the respective sensors 20, 21 and 22 along a second straight line "R2"; said two straight lines R1 and R2 must be parallel and, this is the fundamental condition, the movement of said magnets 40, 41 and 42 toward the respective sensors 20, 21 and 22 must be orthogonal to said straight lines R1 and R2, so that said magnets move respectively along the paths "l", "m" and "n".

In this manner each magnet will approach the respective sensor and, although it also approaches an adjacent sensor—which naturally is necessary and admitted—it will never come to be in a position such that at a certain point along its path it must also move away from the sensor adjacent to the one to which it must correspond.

This condition is met, according to the invention, if said magnets are arranged on the head 59 of the key 10, and consequently the respective sensors must also be arranged so as to respect the conditions explained above, in other words they are aligned along a straight line parallel to the alignment line of the magnets, and must be reachable by the respective magnets with a movement orthogonal to the lines of alignment of the magnets, and of the sensors respectively.

Figure 15:
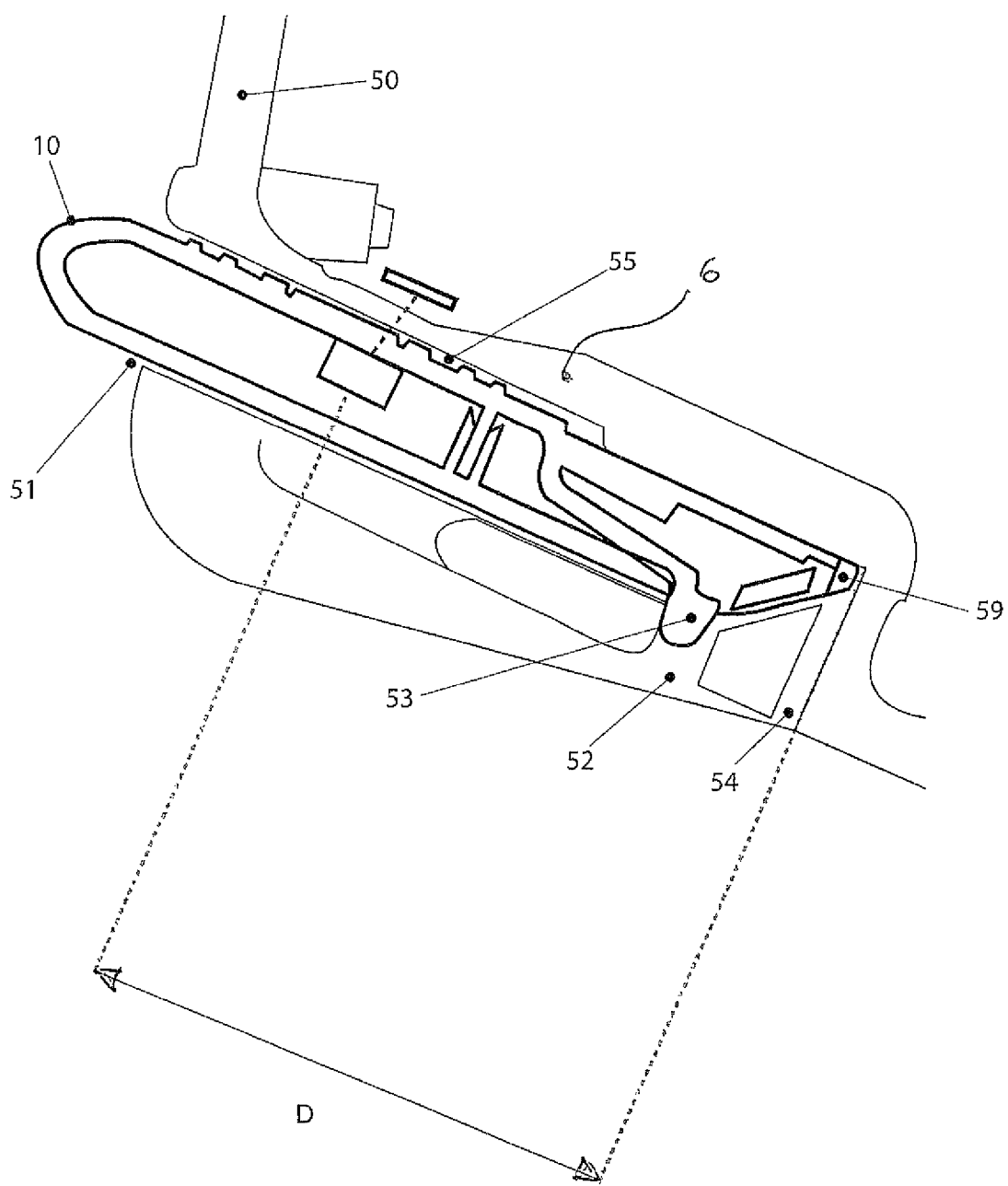
FIG. 15 is a cross-sectional view, orthogonal to the plane of the dashboard, of the key of FIGS. 14 and 14A.

With reference to FIG. 15, said sensors are substantially arranged in absolute proximity to the wall 6 that delimits the cavity 55, and naturally they are arranged from the "external" side of the cavity 55.

With reference to FIGS. 5 and 6, a key 10 is provided with two housings 40A, 41A in which are applied (or may NOT be applied) respective magnets 40, 41 (FIG. 5)

FIG. 6, for example, shows that the magnet 40 is applied in the relative housing 40A, while no magnet has been applied in the housing 41A, which therefore is empty.

Figure 7:
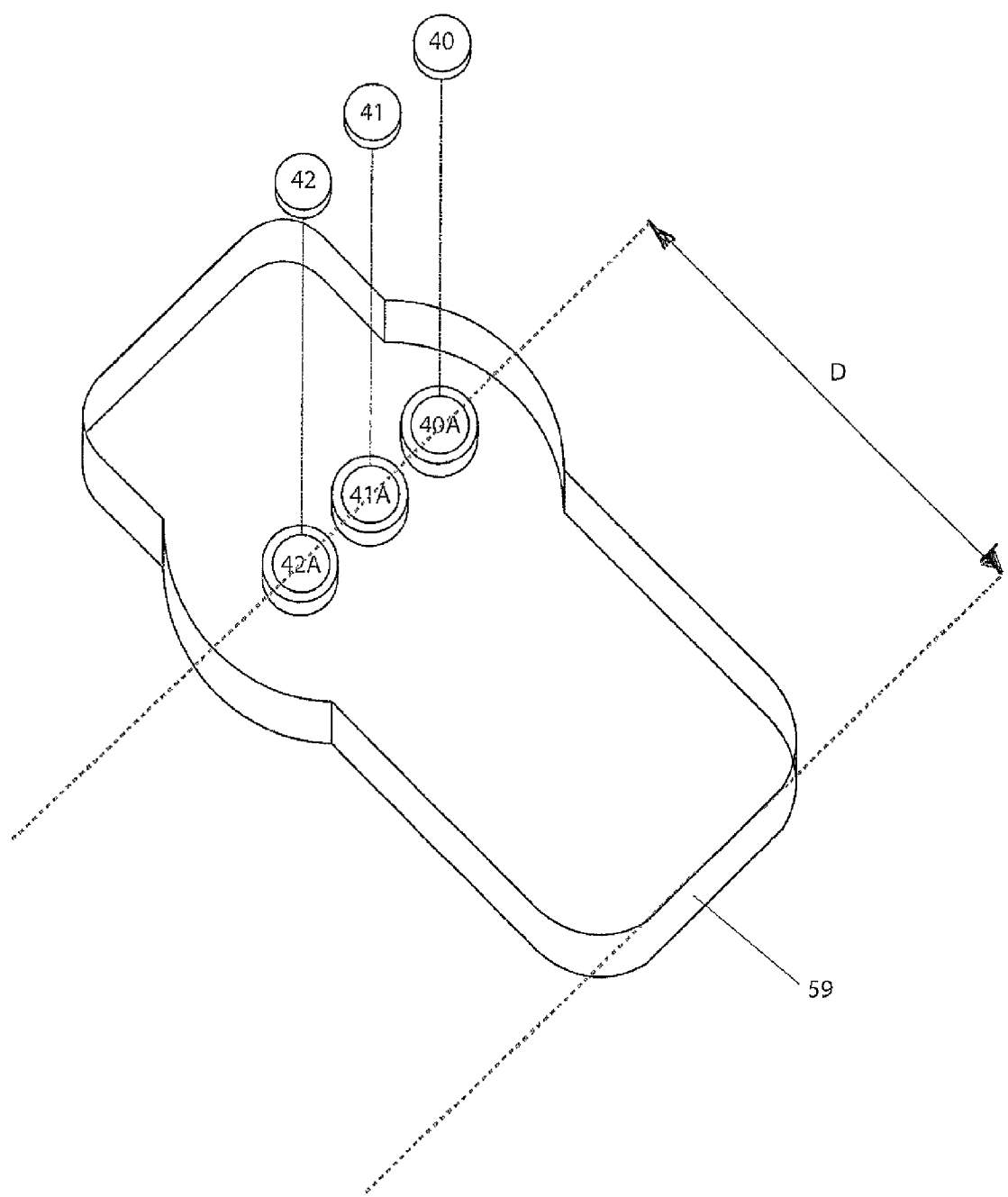
FIG. 7 shows, in a symbolic illustration, a perspective exploded view of a further variant of the key of FIG. 5.

To increase the number of possible combinations, and thus of different codes and therefore different keys, naturally it is possible to increase the number of magnets and of the respective sensors, as shown schematically in FIG. 7, which shows an exploded view of a key with three different magnets 40, 41, 42.

Figure 8:
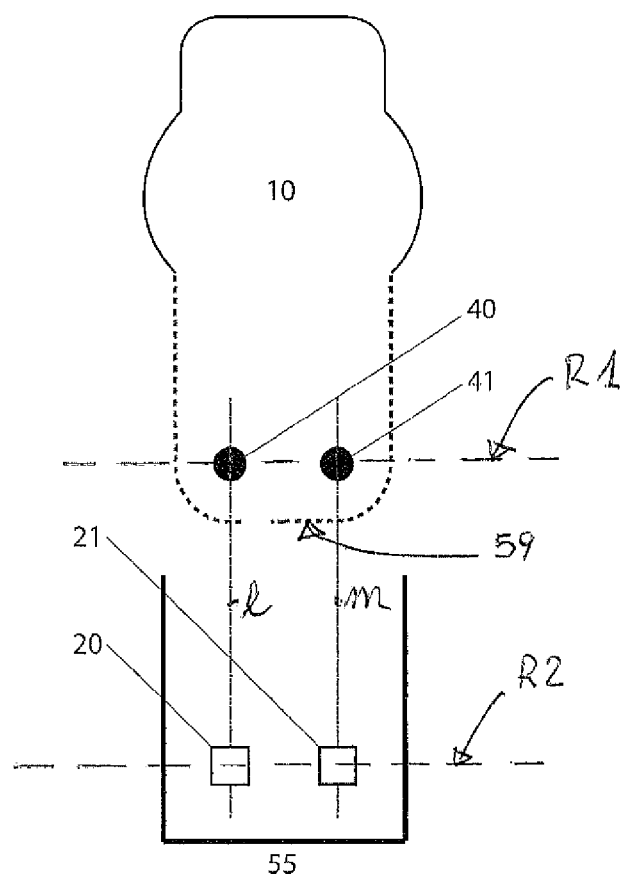
FIGS. 8 and 8A illustrate schematically a first embodiment of a key provided with magnets, and of a corresponding key-lock suitable to house said key and provided with respective Hall-effect sensors.
Figure 8A:
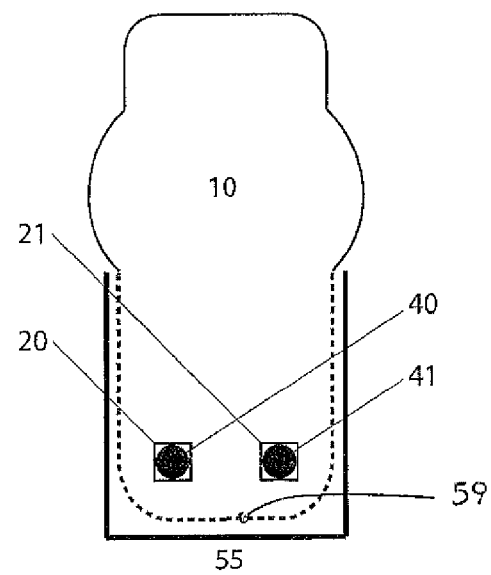

FIGS. 8 and 8A illustrate the case of a key 10 provided with two magnets 40 and 41 and also show symbolically the cavity 55, on outside of which (beyond the wall 6) are arranged the two Hall-effect sensors 20 and 21; in said cavity is inserted the key 10, on the surface of which are arranged two housings in which are applied respective magnets 40, 41.

As explained earlier, said magnets 40 and 41 are aligned on the straight line "R1" and the corresponding sensors are aligned on the straight line "R2" parallel to the straight line "R1".

Also, the direction of insertion of the key in the cavity 55 must be such that the displacement lines "l" and "m" of the two respective magnets 40, 41 are orthogonal to said straight lines "R2" and "R1".

As can be seen in FIG. 8A, when the key 10 is inserted into the relative cavity 55, the two magnets are positioned at the two respective sensors 20 and 21, so that all risks of reciprocal interference are avoided.

Naturally, other different combinations are possible to increase the number of possible keys that can interact with said sensors.

Figure 10:
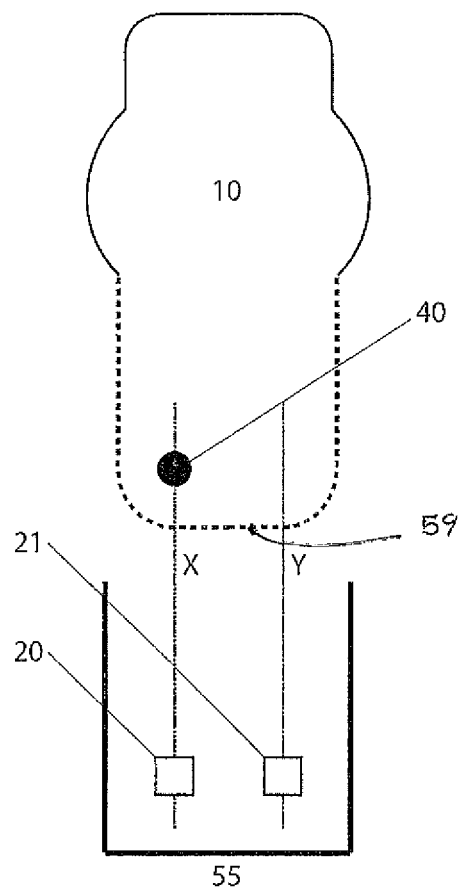
FIGS. 10 and 10A illustrate schematically a third embodiment of a key provided with magnets, and of a corresponding key-lock suitable to house said key and provided with respective Hall-effect sensors.
Figure 10A:
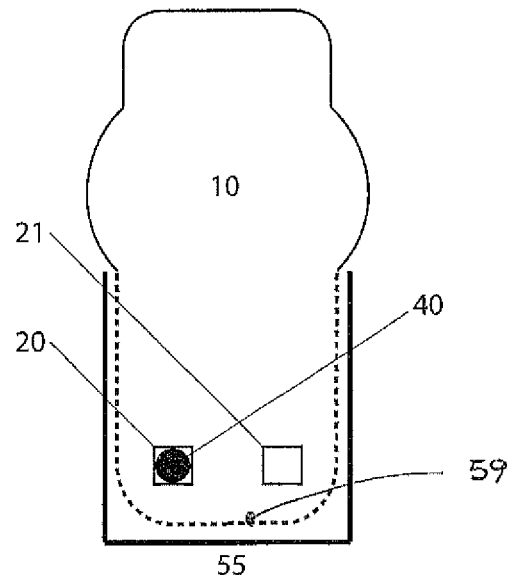
Figure 11:
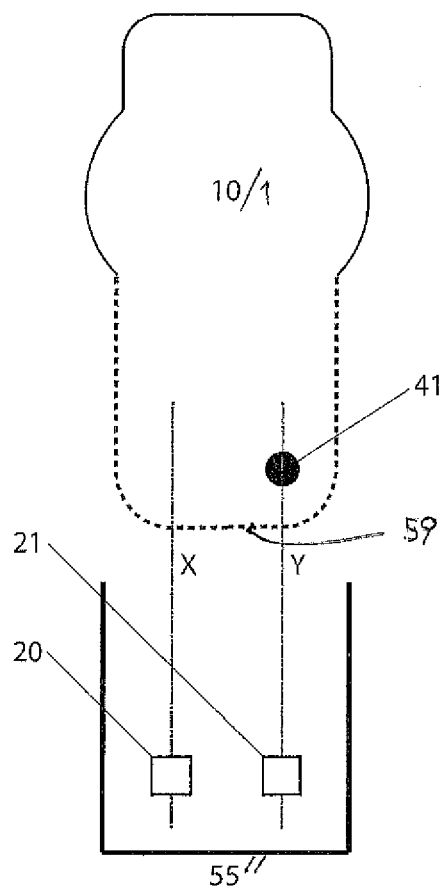
FIGS. 11 and 11A illustrate schematically a fourth embodiment of a key provided with magnets, and of a corresponding key-lock suitable to house said key and provided with respective Hall-effect sensors.
Figure 11A:
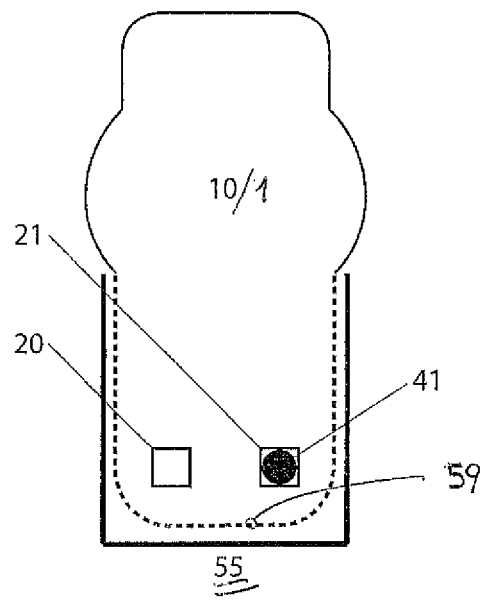

With reference to FIGS. 10 and 10A, the key 10B lacks the magnet 41, and can lack, or not, the relative housing, but it remains provided with the magnet 40; on the other hand, FIGS. 11 and 11A, outline a key 10C that is provided, inversely, with the magnet 41 but not with the magnet 40.

Figure 9:
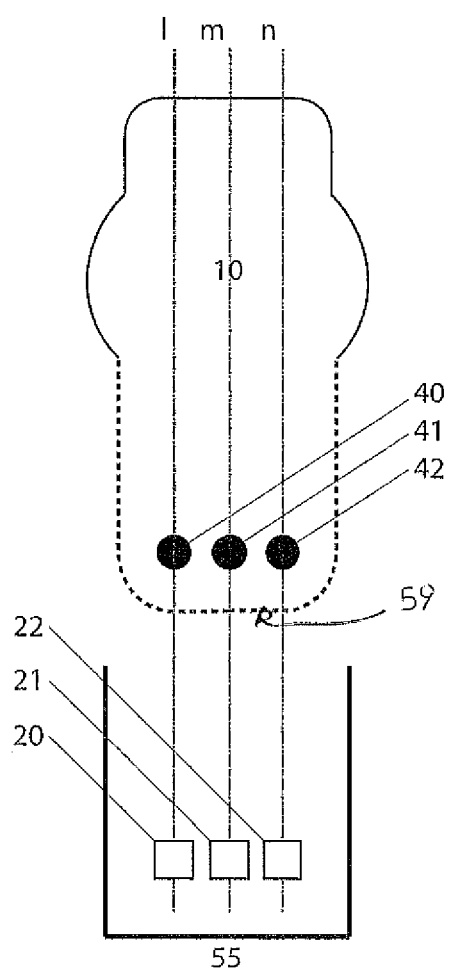
FIGS. 9 and 9A illustrate schematically a second embodiment of a key provided with magnets, and of a corresponding key-lock suitable to house said key and provided with respective Hall-effect sensors.
Figure 9A:
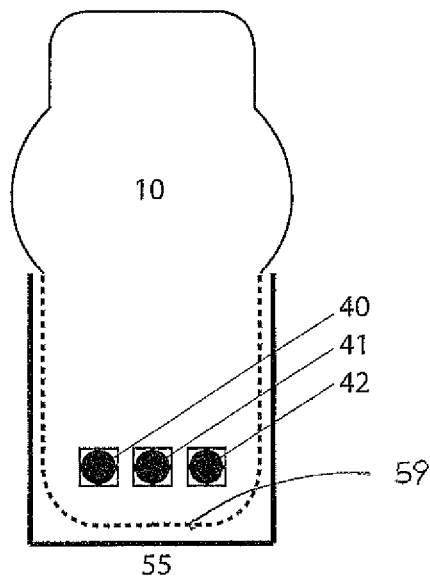

To increase the number of keys that are selectively active with respect to the sensors of the apparatus, the preceding teachings can be extended to the case in which there are more than two sensors, for example as in FIGS. 9 and 9A, in which is shown a solution with three sensors 20, 21, 22 and three magnets 40, 41 and 42, engaged in the same key 10C.

This possibility is contemplated when the number of magnetically different keys to provide is greater in number than 3 or 4, so that there must be available a larger number of magnet-sensor combinations.

Moreover, an improvement and a more advantageous use of the invention is additionally offered by the possibility of increasing the number of selectively active keys without increasing the number of magnets and the relative sensors; such improvement is easily obtained by taking advantage of the bi-polarity characteristics of the pairs of magnets/sensors, that is, by using, in two separate keys, the same pair of magnets/sensors but having inverted polarities from one key to the other key.

This improvement offers a profitable advantage from the economic point of view, because this makes it possible to increase the number of selectively active keys without however increasing the number of possible pairs of magnets/sensors installed in them.

The achievement of this improvement, as also the detection of the polarity of each pair of magnets/sensors, and naturally the processing of the signals and of the consequent information also associated with the actual polarity are information and activities well known in the art, an thus they will not be explained further.

Naturally, such cases are only a quantitative extension of the case of two sensors seen previously, but the same logical and functional considerations described above from the logic point of view are applied to them; thus, for the sake of simplicity, their description will not be repeated.

Finally, it is also possible to devise a configuration of theoretical but still possible type, in which the respective key is completely lacking any magnets; in this case, too, the total lack of magnetic signals is, however, a further information on the type of key, and can be used as any other information to determine a respective group of devices of the apparatus that can be activated (or that reciprocally cannot be activated) by the insertion of said key.

The objection that in this case it would be useless to insert the key because after all it does not supply any magnetic signal can be countered by pointing out that said key 10D can be programmed to actuate electro-mechanical devices of traditional type installed in the apparatus, but not other devices that can be actuated by some signal of magnetic type coming from a key inserted in the cavity 55. Summing up, the use of keys 10A, 10B, 10C, 10D, that are different from the magnetic point of view, generates respectively different signals on the pair of sensors 20 and 21; such different signals are transmitted to appropriate command and control processing devices, not shown, that receive, identify and recognize the various pairs of signals coming from the individual keys 10A, 10B, 10C, 10D, and that thus in effect recognize which one, among the four keys 10A, 10B, 10C, 10D, has been inserted into the cavity 55.

Depending on the key that is identified, said processing means are programmed and designed so as to enable the operation of definite devices belonging to the apparatus.

In short, each key is allowed access to only one respective set of devices, and not to others.

Moreover, as already mentioned, the keys of said figures are mechanically identical, so that, with the key inserted correctly into the cavity 55, they always position themselves in front of the respective Hall sensors 20, 21.

Briefly summing up the fundamental contents of the invention, according to the prior art it evidently could happen that the magnet 41 acts by magnetic interference on the sensor 20 that does not correspond to it, thus transmitting to it a different magnetic signal, one that is unlike the signal that said sensor 20 should instead receive from the respective magnet 40.

If such a possible interference reaches a sufficient intensity, the sensor 20 could be activated and supply a respective signal which, combined with the signal from the other sensor 21, would produce the information that there is a key of completely different type from the key that is actually inserted into the cavity.

This would result in obvious errors in all the subsequent operating sequence. What was briefly pointed out above is known from the prior art, and therefore will not be explained further.

With reference in particular to figures from 8 to 11A, the present invention thus introduces the characteristic of providing one or more Hall-effect sensors, in which it can be substantially impossible that a magnet could improperly interfere with a sensor to which it is not intended.

This characteristic is achieved by designing a plurality of keys and a relative cavity 55 working as a magnetic reader provided with Hall-effect sensors in which:
the keys are provided with at least two respective distinct magnets 40, 41 designed to be, when the key is completely inserted into said cavity, in a position functionally corresponding with predefined respective sensors 20, 21;
at least one first key 10 (FIG. 10) contains a single magnet 40;
at least one second key 10/1 (FIG. 11) includes a single magnet 41;
said magnets 40, 41 are designed to not interfere with sensors 20, 21 with which they are not associated in functional correspondence.

In this manner, with reference again to figures from 8 to 11A, is provided a plurality of keys that are different from the magnetic point of view, and also in relation to their polarities, that can be univocally detected, identified and recognized as different keys by the processing, command and control means with which the apparatus is equipped.

With reference to figures from 8 to 11A, the "head position" 59 of said magnets 40, 41, 42 . . . could reveal itself to be not ideal from the point of view of position of the sensors that those magnets must detect.

In fact, it is appropriate that said sensors are located on the edge of a respective terminal strip 60 (FIG. 6) that is preferably mounted on the inward side of said dashboard 55, and relatively close to the same.

In such circumstances, the insertion of the key in a substantially vertical direction and therefore generally orthogonal to said terminal strip 60, in which the same key is provided with the magnets in the "head position" 59 (see figures from 8 to 11A), causes the final positioning of said magnets to be rather far from the respective sensors.

In order to avoid said disadvantage, according to the present invention said magnets are arranged on the head 59 of the key, but in a different position, that is, at a distance "D" rearward that is not insignificant with regard to the respective head position 59, as can be easily seen in FIGS. 6 and 15, so that said sensors come to be, when the key is completely inserted, in the position that is nearest to the respective sensors.

Figure 13:
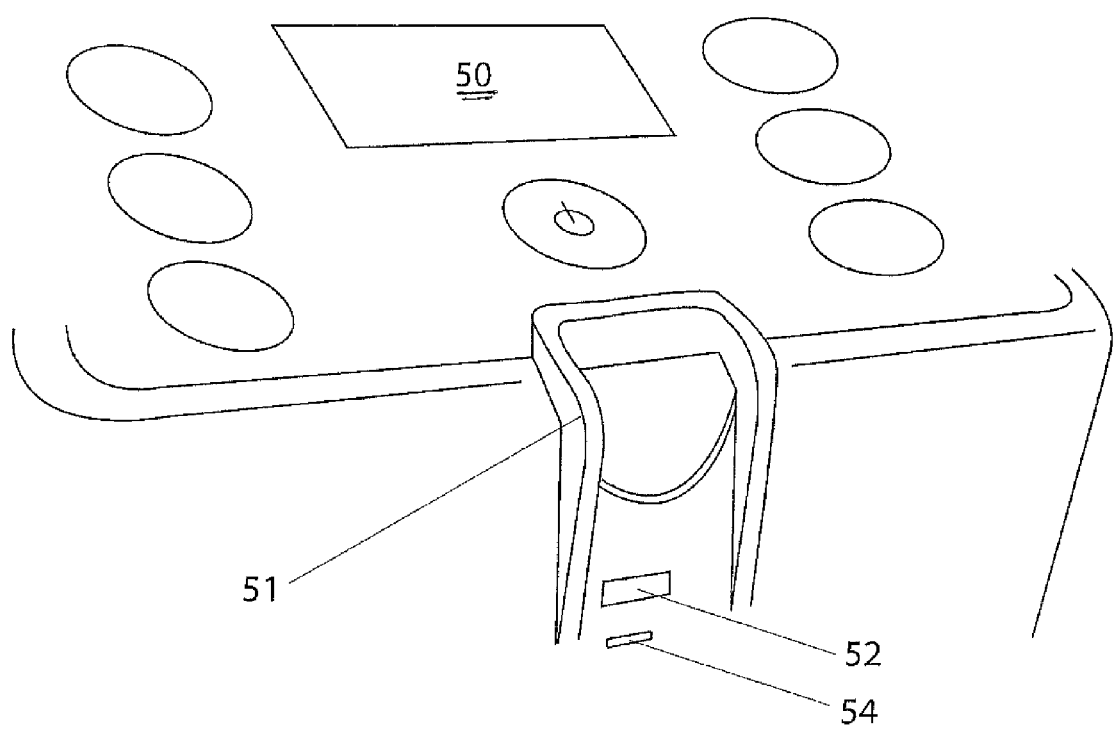
FIG. 13 shows an external and perspective view from above of the entrance portion of the magnetic reader arranged on the dashboard of a machine and used to house a key according to the invention.
Figure 14:
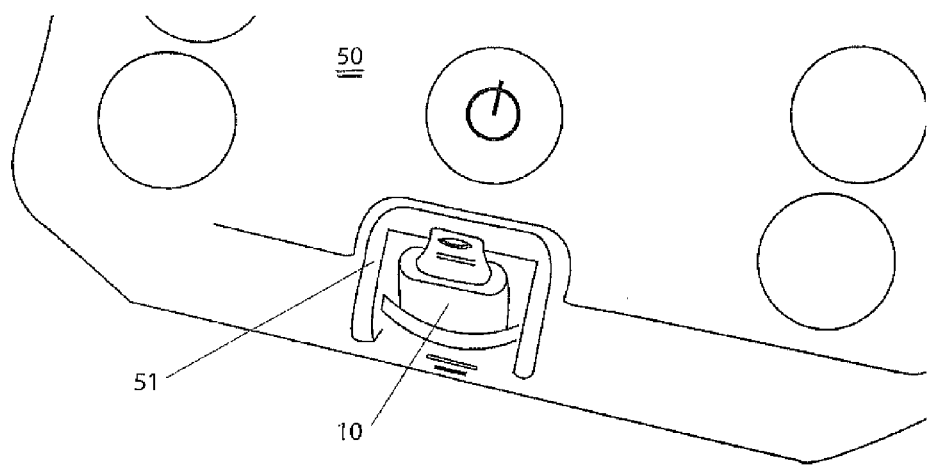
FIGS. 14 and 14A illustrate respective and different views in perspective of the entrance portion of the magnetic reader of FIG. 13, in which a key according to the invention is inserted.
Figure 14A:
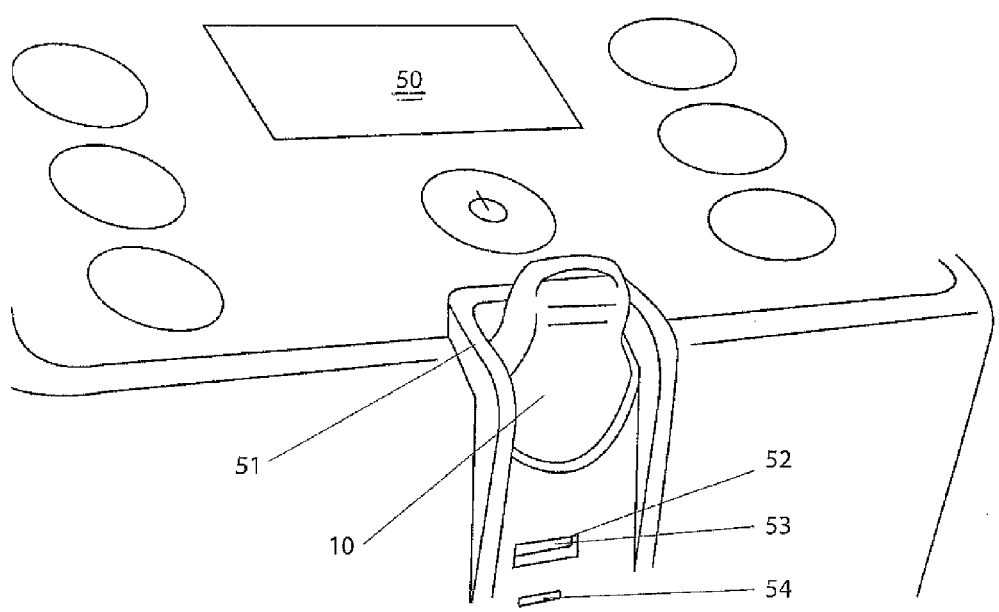

Given the particular intended use of the keys of the present invention, the invention is advantageously improved with the following enhancements:
with reference to FIGS. 13, 14 and 15, said cavity 55 is arranged with a substantially vertical orientation, and near the dashboard 50 of the vehicle or applied thereon, so as to favour the insertion of the key and to achieve a further useful improvement that will be immediately explained hereinbelow;
in fact, as shown in FIGS. 14A and 15, to favour the spontaneous emptying of any liquid, dirt, sludge, etc., in the lower portion of said cavity 55 is provided a through opening 54 that connects the inside of the same cavity with the outside;
furthermore, with reference again to FIGS. 14A and 15, said keys are provided with respective engaging teeth 53, and said cavity 55 is provided with a corresponding seat 52, preferably accessible from outside, made and arranged so as to reciprocally engage when the respective key reaches the respective operating position inside the respective cavity.

The invention claimed is:

1. An apparatus for floor cleaning, the apparatus comprising:
a dashboard;
a cavity that is configured to receive and interact individually with a plurality of keys that are mechanically interchangeable with each other; and
two or more sensors operating according to the Hall effect, the two or more sensors being placed outside the cavity and being located adjacent to a respective wall of the cavity,
wherein:
at least a first key of the plurality of keys includes a first magnet configured to cooperate with a first sensor of the two or more sensors,
at least a second key of the plurality of keys includes a second magnet configured to cooperate with a second sensor of the two or more sensors,
at least a third key of the plurality of keys includes at least two magnets, each of the at least two magnets of the third key is configured to cooperate with a respective sensor of the two or more sensors, the first sensor and the second sensor are arranged along a first line outside the cavity, the at least two magnets of the third key are aligned along a second line, the first line and the second line being parallel to each other, the first magnet of the first key, the second magnet of the second key, and the at least two magnets of the third key are arranged such that each magnet only passes over its respective sensor during insertion of the first key, the second key, or the third key, respectively, into the cavity, and an insertion direction of the plurality of keys into the cavity is orthogonal to the first line such that the first magnet and the second magnet are located as near as possible to the first sensor and the second sensor, respectively, while simultaneously maintaining a maximum distance from the second sensor and first sensor, respectively.

2. The apparatus for floor cleaning according to claim 1, wherein the second line is arranged at a same distance from a head of each of the plurality of keys, respectively.

3. The apparatus for floor cleaning according to claim 1, wherein at least two keys of the plurality of keys are provided with a same couple of magnets and corresponding sensors, wherein said magnets show inverted polarities from one key to the other key.

4. The apparatus for floor cleaning according to claim 1, further comprising a controller configured to identify a combination of signals received from the sensors, the signals corresponding to a type of key that is introduced.

5. The apparatus for floor cleaning according to claim 1, wherein the cavity is arranged in a vertical orientation, and close to a wall of the dashboard.

6. The apparatus for floor cleaning according to claim 5, wherein a through-aperture is formed in a lower portion of the cavity, the through-aperture connecting an inner room of the cavity to an outside of the cavity.

7. The apparatus for floor cleaning according to claim 1, wherein each of the plurality of keys are provided with respective engaging teeth; and the cavity is provided with a corresponding seat, arranged so as to reciprocally engage with the respective engaging teeth when each of the plurality of keys reaches an operating position inside cavity.

8. An apparatus for floor cleaning comprising:

a dashboard;

a cavity that is configured to receive and interact individually with a plurality of keys that are mechanically interchangeable with each other; and two or more sensors operating according to the Hall effect, the two or more sensors being placed outside the cavity and being located adjacent to a respective wall of the cavity, wherein:

the plurality of keys includes at least a first key and a second key;

each of the plurality of keys independently contains one or more magnets;

the one or more magnets contained within each of the plurality of keys are each configured to cooperate with a respective sensor of the two or more sensors;

the two or more sensors are arranged along a line that is orthogonal to an insertion direction of the plurality of keys into the cavity;

the one or more magnets are arranged within each of the plurality of keys such that each of the one or more magnets contained within the first key and each of the one or more magnets contained within the second key only passes over its respective sensor during insertion of the first key and the second key, respectively, into the cavity; and each of the one or more magnets contained within the first key and each of the one or more magnets contained within the second key is located as near as possible to its respective sensor while simultaneously maintaining a maximum distance from an adjacent sensor during insertion of the first key and the second key, respectively, into the cavity.

\* \* \* \* \*